United States Patent [19]

Phy

[11] Patent Number: 4,674,808
[45] Date of Patent: Jun. 23, 1987

[54] SIGNAL GROUND PLANES FOR TAPE BONDED DEVICES

[75] Inventor: William S. Phy, Los Altos Hills, Calif.

[73] Assignee: Fairchild Semiconductor Corporation, Cupertino, Calif.

[21] Appl. No.: 797,283

[22] Filed: Nov. 12, 1985

[51] Int. Cl.⁴ .............................................. H01R 4/66
[52] U.S. Cl. ..................................... 439/108; 439/68
[58] Field of Search ........................ 339/17 CF, 14 R; 361/414; 357/80; 174/52 FP

[56] References Cited

U.S. PATENT DOCUMENTS

| | | | |
|---|---|---|---|
| 4,459,607 | 7/1984 | Reid | 357/80 X |
| 4,513,355 | 4/1985 | Schroeder et al. | 339/17 CF X |
| 4,571,354 | 2/1986 | Maxwell | 357/80 X |

Primary Examiner—Eugene F. Desmond
Attorney, Agent, or Firm—Stephen J. Phillips; David H. Carroll; James M. Heslin

[57] ABSTRACT

A multiple layer tape bonding technique interconnects an integrated circuit chip having signal and ground bonding pads located thereon to other electrical devices. The tape bonding structure is comprised of a first layer having electrically isolated individual signal conductors coupled to respective ones of the signal bonding pads. The individual signal conductors extend away from the integrated circuit chip in an approximately parallel-spaced relationship to one another. An electrically insulating layer having a predefined thickness is deposited atop and adjacent the first layer. A ground plane layer overlies the insulating layer. The ground plane layer is comprised of a plurality of individual ground conductors coupled to respective individual ones of the ground bonding pads of the integrated circuit chip. The individual ground conductors overlie the insulating layer in a precisely spaced parallel relationship to the corresponding individual signal conductors. The individual ground conductors can be ieither electrically commoned, or electrically isolated to allow for individual tapering for impedance matching. The signal and grounding pads on the integrated circuit chip can be positioned relative to to each other in either a parallel aligned spaced relationship or in alternating and staggered spaced relationship to each other.

22 Claims, 3 Drawing Figures

SIGNAL GROUND PLANES FOR TAPE BONDED DEVICES

This invention relates to integrated circuit tape bonding, and more particularly to a means to provide signal ground planes for tape bonded devices.

With high speed integrated circuit devices, it is desirable to provide ground planes at precisely spaced intervals relative to the signal leads extending from the integrated circuit chip. With existing t.a.b. tape manufacturing technology, vias would be required between conductive layers to achieve signal ground planes for the tape bonded devices. This would increase cost and manufacturing complexity, and would decrease reliability.

Prior art attempts at providing ground planes have used multiple ground traces in multi-layer ceramic packages, and the use of multiple wire conductors to reduce inductance. However, these prior art attempts have encountered problems such as non-uniform separation of the ground plane from the signal layer and ineffective impedance matching of wires.

In accordance with the present invention a tape bonding structure and methodology is described which provides ground planes at precisely spaced intervals relative to the signal leads extending from the integrated circuit chip or other tape bonded device, and which is compatible with existing t.a.b. tape manufacturing technology without requiring vias between conductive layers. The tape bonding method and structure of the present invention overcomes the prior art's problems by providing a fixed separation at a very small distance. For example, the spacing between the signal and ground planes can be made from one to five mils.

A multiple layer tape bonding technique interconnects an integrated circuit chip or other tape bonded device, having signal and ground bonding pads located thereon to other electrical devices. The tape bonding structure is comprised of a first layer having electrically isolated individual signal conductors coupled to respective ones of the signal bonding pads. The individual signal conductors extend away from the integrated circuit chip in an approximately parallel-spaced relationship to one another. An electrically insulating layer having a predefined thickness is deposited or laminated atop and adjacent the first layer. A ground plane layer overlies the insulating layer. The ground plane layer is comprised of a plurality of individual ground conductors coupled to resepective individual ones of the ground bonding pads of the integrated circuit chip. The individual ground conductors overlie the insulating layer in a precisely spaced parallel relationship to the corresponding individual signal conductors. The individual ground conductors can be either electrically commoned, or electrically isolated to allow for individual tapering for impedance matching. The signal and grounding pads on the integrated circuit chip can be positioned relative to each other in either a parallel aligned spaced relationship or in alternating and staggered spaced relationship to each other.

BRIEF DESCRIPTION OF THE DRAWINGS

These and other objects and advantages of the present invention can be better understood from the following detailed description of the drawings when read in conjunction with the drawings, wherein.

DETAILED DESCRIPTION OF THE DRAWINGS

Figure 1:
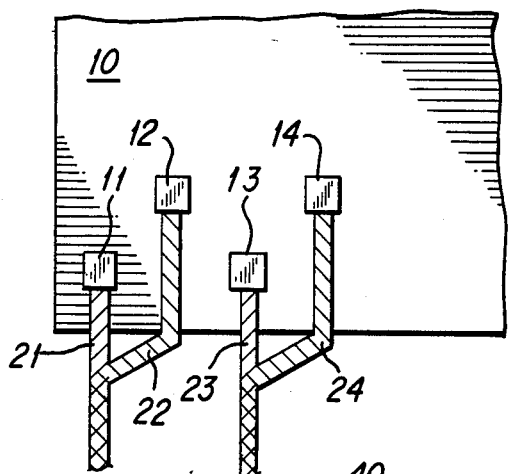
FIG. 1 is a top view of a tape bonding structure herein signal pads 11 and 13 and bonding pads 12 and 14 are staggered and alternated, and wherein the individual ground conductors are tapered separately for impedance matching.

Referring to FIG. 1, an illustration of tape bonding with precisely spaced signal ground planes is illustrated for one embodiment of the invention. As illustrated in FIG. 1, an integrated circuit chip 10 has signal bonding pads 11 and 13 and ground bonding pads 12 and 14 adjacent one edge of the chip. Conductors 21-24 are coupled to the bonding pads and extend therefrom off the chip. As illustrated in FIG. 1, for an additive metal processing embodiment, signal conductors 21 and 23 are coupled to signal bondng pads 11 and 13, respectively. Each signal conductor 21 and 23 has a corresponding ground conductor 22 and 24 associated therewith, respectively. The ground conductors 22 and 24 are coupled to the ground bonding pads 12 and 14. The ground conductors 22 and 24 extend from the bonding pads away from the chip so as to overlay at a precise spacing, the associated respective signal conductors 21 and 23. An insulating dielectric layer 30 is interposed between each of the signal conductors and ground conductors to maintain the precise spacing, as shown more clearly in FIG. 2.

Figure 2:
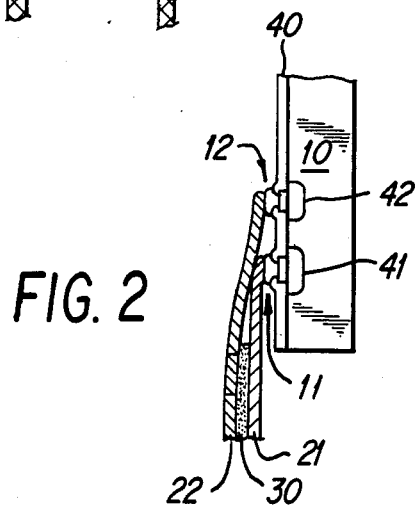
FIG. 2 is a side view of the tape bonding structure of FIG. 1, illustrating the spaced and positional relationships of the first signal layer, electrically insulating layer and ground layer of the tape bonding structure relative to the integrated circuit chip.

Referring to FIG. 2, a side view of the tape bonding structure of FIG. 1 is shown. FIG. 2 clearly shows the relationship of the signal conductor 21, insulator 30, and ground conductor 22, relative to each other and to the chip 10. Also shown in FIG. 2 are a pasivation layer 40 over the substrate 10 and respective diffused regions 41 and 42 associated with bonding pads 11 and 12. Bonding pads 11 and 12 comprise respective gold bumps and aluminum pads, as is known in the art.

Figure 3:
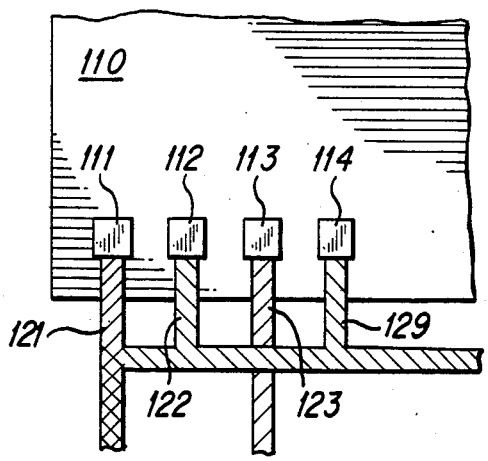
FIG. 3 is a top view illustrating a tape bonding structure having alternating and parallel aligned spaced signal and ground bonding pads on the integrated circuit chip, and having individual ground conductors electrically commoned.

Referring to FIG. 3, an alternate embodiment of the signal ground planes for tape bonded devices in accordance with the present invention is illustrated, for formed-down embodiment. In the formed down version, a second conductive layer is laminated atop the dielectric layer formed on top of the base layer signal conductor. FIG. 3 also illustrates an alternate ground plane geometry where all ground conductors are electrically commoned. This is distinguished from the geometry of FIG. 1, where each of the signal ground conductors is isolated, such that individual ground conductor impedances can be individually tailored.

The staggered or double ranked geometry for signal versus grounding bonding pads as illustrated in FIG. 1 is particularly useful in high density lead geometries. Where a low lead count, or coarse pitch is used, the staggered ranked geometry of FIG. 1 can be replaced with an in-line bonding pad geometry as illustrated in FIG. 3.

The present invention is useful with both two layer and three layer film manufacturing technology. With two layer film technology, the present invention can be utilized, for example, by forming a second conductive layer to the dielectric. With three layer film manufacturing technology, for example, the present invention can be utilized by employing additive metal processing or by a laminating process.

In accordance with one embodiment of the present invention, individual ground planes are applied to the tape bonded high speed devices, by utilizing two layers of metal with a single layer of dielectric on tab tape.

The two conductive layers are separated by a dielectric layer. In the preferred embodiment, the insulator 30 of FIG. 2 is comprised of polyimide, which is a generic name for an insulator available from DuPont under the trademarked name KAPTON. The conductive layers are configured so as to provide parallel ground plane conductors relative to the signal conductors. The ground planes can be configured so as to provide individual ground lines which can be tailored individually for impedance, such as illustrated in FIG. I, or can be interconnected to form a single ground plane with multiple extension fingers therefrom, as illustrated in FIG. III.

In an alternate embodiment, the ground plane and signal conductors are arranged such that tape bonding of both the inner and outer lead can be performed simultaneously with single thermodes.

Utilization of the present invention provides the ability to manufacture multiple conductive layer tape with existing technology, without requiring the use of vias, and provides a technology compatible with two-layer or three-layer processes. This invention is particularly useful in the manufacture of tape bonded high-speed devices, such as semiconductor memory or logic devices. Other application areas include high-speed logic, particularly parallel or parallel pipeline architectures, etc.

A particular advantage which utilization of the present invention provides is the means for suitably tailoring the impedance of the ground planes at the termination points, to allow matching of impedance. For example, 50 Ohm impedances can be provided. When dealing with high-speed signals, it is important to match impedance both for the on-chip conductor runs and for the off-chip conductor to IC pin termination. The present invention allows for suitable tailoring of the ground planes for both purposes. Additionally, proper matching of impedance reduces reflection problems. The tailoring of the width of the conductors determines the characteristic impedance therefor. This concept of tailoring the width of the conductors to determine the characteristic impedance is well known in the art, and can be derived from existing literature on flat transmission lines.

The spacing between the signal conductor and ground plane conductor should be precisely controlled, and uniform for bonding to a chip. For example, in a preferred embodiment, the minimum spacing between the signal conductor and ground plane conductor is 25 microns.

The width of the illustrated signal conductors in FIGS. 1-3, and the relative spacing and angling of conductors are provided for illustration purposes. In practice, many variations are possible, and some form of stress relief is usually provided.

While there have been described above various embodiments of the present invention, for the purposes of illustrating the manner in which the invention may be used to advantage, it will be appreciated that the invention is not limited to the disclosed embodiments. Accordingly, any modification, variation or equivalent arrangement within the scope of the accompanying claims should be considered to be within the scope of the invention.

What is claimed is:

1. A multiple layer tape bonding structure for interconnecting an integrated circuit chip having signal and ground bonding pads thereon to other electrical devices, said structure comprising:
   a first layer having electrically isolated individual signal conductors coupled to respective ones of the signal bonding pads, said individual signal conductors extending away from the chip in approximately parallel spaced relationship to one another;
   an electrically insulating layer at a predefined thickness deposed atop and adjacent the first layer;
   a ground plane layer having a plurality of individual ground conductors coupled to respective ground bonding pads, said individual ground conductors overlying said insulating layer in a precise spaced parallel relationship to corresponding individual signal conductors.

2. The structure as in claim 1 wherein the individual ground conductors are electrically isolated.

3. The structure as in claim 2 wherein each of said ground conductors is individually tapered for impedance matching.

4. The structure as in claim 1 further characterized in that the signal and ground bonding pads are in an alternating and parallel aligned spaced relationship to each other.

5. The structure as in claim 1 further characterized in that the signal and ground bonding pads are in an alternating and staggered spaced relationship to each other.

6. A tape bonding structure for coupling to an integrated circuit having signal and ground bonding pads thereon, said structure comprising:
   a plurality of individual conductors, each separated by a predefined insulated spacing and in approximately parallel relationship to each other, coupled to individual ones of the signal bonding pads, forming a first layer of the tape bonding structure;
   an insulating layer of a predefined fixed thickness affixed adjacent to, substantially parallel to atop the first layer; and
   a third comprising a plurality of individual conductors, coupled to individual ones of the ground bonding pads, at a predefined spacing in approximately parallel relationship to each other, affixed adjacent to, substantially parallel to and atop at least some of the signal conductors in the first layer.

7. The structure as in claim 6 wherein the insulating layer is deposited atop the first layer.

8. The structure as in claim 7 wherein the third layer is deposited atop the insulating layer.

9. The structure as in claim 6 wherein the third layer is laminated atop the insulating layer.

10. The structure as in claim 6 wherein the layer is affixed to the insulating layer utilizing additive metal processing.

11. The structure as in claim 6 wherein the predefined thickness of the insulating layer is at least twenty-five microns.

12. The structure as in claim 6 wherein at least some of the individual ground conductors are electronically commoned.

13. The structure as in claim 6 wherein the individual ground conductors are individually tapered for impedance matching.

14. The structure as in claim 6 further characterized in that said integrated circuit signal ground bonding pads are in an alternating and parallel aligned spaced relationship.

15. The structure as in claim 6 further characterized in that said integrated circuit signal and ground bonding pads are in an alternating and staggered relationship to each other.

16. The structure as in claim 6 wherein the first and third layers are metal and the insulating layer is a dielectric.

17. The structure as in claim 6 wherein the insulating layer is comprised of polyimide.

18. The structure as in claim 6 further characterized in that said individual conductors of said first and third layers are coupled to signal and ground connections, respectively, of electronic components which interact with the integrated circuit.

19. A multiple layer tape bonding structure for interconnecting an integrated circuit chip having signal and ground bonding pads thereon to other electrical devices, said structure comprising:
 a first layer having electrically isolated individual signal conductors coupled to respective ones of the signal bonding pads, said individual signal conductors extending away from the chip in approximately parallel spaced relationship to one another;
 an electronically insulating layer at a predefined thickness disposed atop and adjacent the first layer;
 a ground plane layer having a plurality of individual ground conductors coupled to respective ground bonding pads, at least some of said individual ground conductors overlying said insulating layer in a precise spaced parallel relationship to corresponding individual signal conductors, wherein all individual ground conductors which are not overlying signal conductors are commoned to ground conductors which are overlying signal conductors.

20. The structure as in claim 19 wherein each of said ground conductors is individually tapered for impedance matching.

21. The structure as in claim 19 further characterized in that the signal and ground bonding pads are in an alternating and parallel aligned spaced relationship to each other.

22. The structure as in claim 19 further characterized in that the signal and ground bonding pads are in an alternating and staggered spaced relationship to each other.

* * * * *